United States Patent
Tripard et al.

(10) Patent No.: US 7,612,484 B2
(45) Date of Patent: Nov. 3, 2009

(54) HIGH-DEFORMATION COMPOSITE MICRORESONATOR

(75) Inventors: Amyot Tripard, Le Monetier les Bains (FR); Yves Brechet, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 474 days.

(21) Appl. No.: 11/630,773

(22) PCT Filed: Jun. 29, 2005

(86) PCT No.: PCT/FR2005/050520

§ 371 (c)(1),
(2), (4) Date: Dec. 26, 2006

(87) PCT Pub. No.: WO2006/013301

PCT Pub. Date: Feb. 9, 2006

(65) Prior Publication Data

US 2009/0115283 A1     May 7, 2009

(30) Foreign Application Priority Data

Jul. 1, 2004    (FR)    .................... 0451398

(51) Int. Cl.
*H03H 9/00* (2006.01)
*H03H 9/24* (2006.01)

(52) U.S. Cl. ........................ 310/309; 216/17
(58) Field of Classification Search ................ 310/309; 216/17
See application file for complete search history.

(56) References Cited

U.S. PATENT DOCUMENTS

| | | | |
|---|---|---|---|
| 6,628,177 B2 * | 9/2003 | Clark et al. | 333/186 |
| 2002/0105393 A1 | 8/2002 | Clark et al. | |
| 2003/0168929 A1 | 9/2003 | Ma et al. | |
| 2005/0151442 A1 * | 7/2005 | Kihara et al. | 310/309 |
| 2005/0206479 A1 * | 9/2005 | Nguyen et al. | 333/186 |
| 2008/0150656 A1 * | 6/2008 | Hagelin et al. | 333/200 |

FOREIGN PATENT DOCUMENTS

JP        2006-319387      * 11/2006

OTHER PUBLICATIONS

Clark T.-C. Nguyen, "Micromechanical Circuits for Communication Transceivers", IEEE BCTM 8.2, XP-10524193, Sep. 24, 2000, pp. 142-149.

Siavash Pourkamali, et al., "SOI-Based HF and VHF Single-Crystal Silicon Resonators With SUB-100 Nanometer Vertical Capacitive GAPS", IEEE Transducers '03 The 12International Conference of Solid State Sensors, Actuators and Microsystems, Jun. 8-12, 2003, pp. 837-840.

Jing Wang, et al., "1.14-GHz Self-Aligned Vibrating Micromechanical Disk Resonator", IEEE Radio Frequency Integrated Circuits Symposium, 2003, pp. 335-338.

Ville Kaajakari, et al., "Square-Extensional Mode Single-Crystal Silicon Micromechanical RF-resonator", IEEE Transducers '03 The 12$^{th}$ International Conference on Solid State Sensors, Actuators and Microsystems, Jun. 8-12, 2003, pp. 951-954.

Mohamed A. Abdelmoneum, et al., "Stemless Wine-Glass-Mode Disk Micromechanical Resonators", IEEE, 2003, pp. 698-701.

* cited by examiner

*Primary Examiner*—Thomas M Dougherty
(74) *Attorney, Agent, or Firm*—Oblon, Spivak, McClelland, Maier & Neustadt, L..L.P (57) ABSTRACT

An electromechanical resonator including a vibrating body, at least one excitation electrode, and at least one detection electrode. The vibrating body includes a first part made of a first material with a first Young's modulus and a second part made of a second material with a second Young's modulus, less than the first Young's modulus, the second part being at least partially located facing the detection electrode.

17 Claims, 6 Drawing Sheets

HIGH-DEFORMATION COMPOSITE MICRORESONATOR

TECHNICAL DOMAIN AND PRIOR ART

This invention relates to the domain of microresonators.

Microresonators are used for example in the field of mobile telephony in the composition of filters, VCOs (voltage control oscillators) and reference oscillators.

Resonator type components preferably with the following characteristics are required in order to achieve integration:
- small dimensions,
- variable resonant frequencies (from less than a few MHz to more than a few GHz),
- high quality factor,
- low signal losses (highest possible output level), which requires strong electromechanical coupling,
- very good stability in temperature and in time,
- compatibility with microelectronic processes.

Two systems derived from conventional components are used to obtain electrical resonance:
- RLC circuits that can easily be integrated onto wafers but have poor performances,
- quartz resonators that have high performances but cannot be integrated into a manufacturing process based on the micro-system technology. They are necessarily machined separately and are then added on. This results in a high cost and large size.

MEMS components include SAW ("Surface Acoustic Wave") type resonators: these components will make use of surface wave propagation in a piezoelectric material.

These waves are generated and then detected by comb-shaped electrodes. Component dimensions define the frequency for which wave propagation takes place. Other components of the signal are not transmitted.

SAWs have fairly good performances. However, they are large (1 cm$^2$), cannot be integrated in microelectronics technology and are limited in frequency (critical dimensions).

There are also "FBAR" ("film bulk acoustic resonator") type resonators: this is a stack of the "acoustic insulator-electrode-piezoelectric material-electrode" type. Acoustic waves are propagated between the two electrodes. Resonance is obtained when the half wavelength is equal to the acoustic path traveled. These components have good performances, but are not integrated into microelectronic processes.

Components with electromechanical resonance use the mechanical resonance of one element (beam in bending, expansion of a cylinder, for example as described in the article by J. Wang. and al., "1.14 GHZ self-aligned vibrating micromechanical disk resonator" IEEE Radio Frequency Integrated Circuits Symposium (2003)) to filter the signal.

The vibrating body may be activated (and detected if detection is installed) in three different ways:
- using piezoelectric materials,
- by means of a magnetic field,
- or electrostatically (capacitive detection by variation of the air gap).

The first two techniques are difficult to integrate at the moment and cannot achieve very high performances.

Electromechanical excitation and capacitive detection resonators have been the most highly developed. This is due to the high performances that can be obtained (in terms of quality factor, resonant frequency), and also the possibility of integrating these components into a microelectronics process.

However, detection of the signal at the component output is not easy: the literature mentions components that could not be tested.

This is due to the small displacements obtained, particularly for resonators with volume waves, as for example described for disks and plates in the article by V. Kaajakari, T. Mattila, A. Oja, J. Kiihamaki, H. Koskenvuori, P. Rantakari, I. Tittonen, H. Seppa, "Square-extensional mode single-crystal silicon micromechanical RF-resonators", IEEE Transducers 03 (2003).

The resonator according to the invention is compatible with piezoelectric actuation (and detection). Electrostatic actuation is preferred, for integrability reasons.

PRESENTATION OF THE INVENTION

The invention relates to an electromechanical resonator comprising a vibrating body, at least one excitation electrode and at least one detection electrode, characterised in that the vibrating body comprises a first part made of a first material with a first Young's modulus and a second part made of a second material with a second Young's modulus, less than the first Young's modulus, this second part being at least partially located facing the detection electrode.

The electromechanical resonator according to the invention is distinguished from volume wave resonators (mainly disks and plates) particularly by its composition and by the deformations that it can achieve.

The vibrating body of resonators developed elsewhere is composed of a single material (silicon disk, nickel plate, etc.). This material is selected for its mechanical characteristics: high stiffness (high Young's modulus so as to increase the resonant frequency) and low energy losses (for example by heating, loss at the grain joints). On the other hand, these materials deform little, which makes it difficult to detect the variation in the air gap.

The resonator according to the invention can be used to achieve high performances (quality factor, resonant frequency, among others), while having large local deformations.

The first material is preferably a material with high mechanical characteristics and assuring good performances of the component, in particular in terms of resonant frequency and quality factor.

The second material has a lower stiffness (low second Young's modulus, or less than the first), which enables large deformations and if possible low losses by heating.

For example, the following materials may be used:
- first material: monocrystalline silicon, nickel or diamond,
- second material: aluminium, gold, Zinc or Magnesium.

For example, the vibrating body may be circular or square.

The electrodes may be arranged at 90° from each other.

The maximum dimension of such a resonator is preferably less than 1 mm, and depends on the application. For example for mobile telephony applications, the maximum dimension is typically less than 50 μm.

For example, the second material may be locally present over a thickness e between 70% of 100% of the thickness E of the vibrating body.

Such a device advantageously has a single anchor or stand connecting it to a substrate.

The invention also relates to a process for making an electromechanical resonator comprising:
- a step to etch at least one cavity in a base made of a first material, with a first Young's modulus, a step to deposit a second material in said cavity with a second Young's modulus less than the first Young's modulus.

This process may also comprise an electrode production step facing the second material.

An etching step releases the resonator from a substrate, only leaving a connecting base to this substrate.

The cavity(ies) may be etched over a thickness e of between 70% and 95% of the thickness E of the base.

BRIEF DESCRIPTION OF THE FIGURES

FIGS. 5A-5I represent steps in a process according to the invention, FIGS. 6A-6J represent steps in another process according to the invention.

DETAILED PRESENTATION OF PARTICULAR EMBODIMENTS

A first embodiment of the invention will now be described with reference to FIGS. 1A and 1B.

This is an example of a cylindrical type resonator with capacitive transduction. But it may also relate to plate type resonators and more generally to volume wave resonators.

The proposed component consists of two distinct parts 2, 3.

A first part 2 is dedicated to mechanical resonance. It comprises a vibrating body and means 6 anchoring the body to a substrate 11. It is a "composite" cylinder (composed of at least two distinct materials), anchored at the centre of one of its bases by a cylindrical base 6 of small dimensions.

A second transduction part 3 is aimed at creating a mechanical signal from an electrical signal (excitation) and vice versa. Detection is separate in the case of a component with two ports but in all cases, detection is not necessarily separate from excitation.

In this second part, there are one or several detection electrodes 10, 12 and a transduction means, a capacitive means in this example. There can only be one detection electrode.

There are also one or more excitation electrodes 14, 16. They generate an electrostatic force at the vibrating body that may or may not start mechanical resonance.

Therefore, in this example there are four electrodes and they are facing the lateral face of the cylinder at a relative angular distance of 90°, the two detection electrodes (respectively, excitation electrodes) being diametrically arranged. As a variant, the same electrodes may be used both for excitation and detection. In this case, it might be decided to place two of them diametrically opposite each other on the cylinder.

The "resonator vibrating body" means the element that is required to start resonance at a specific frequency.

The anchors 6 and the elements connected to the anchor are not concerned by this term.

Figure 1A:
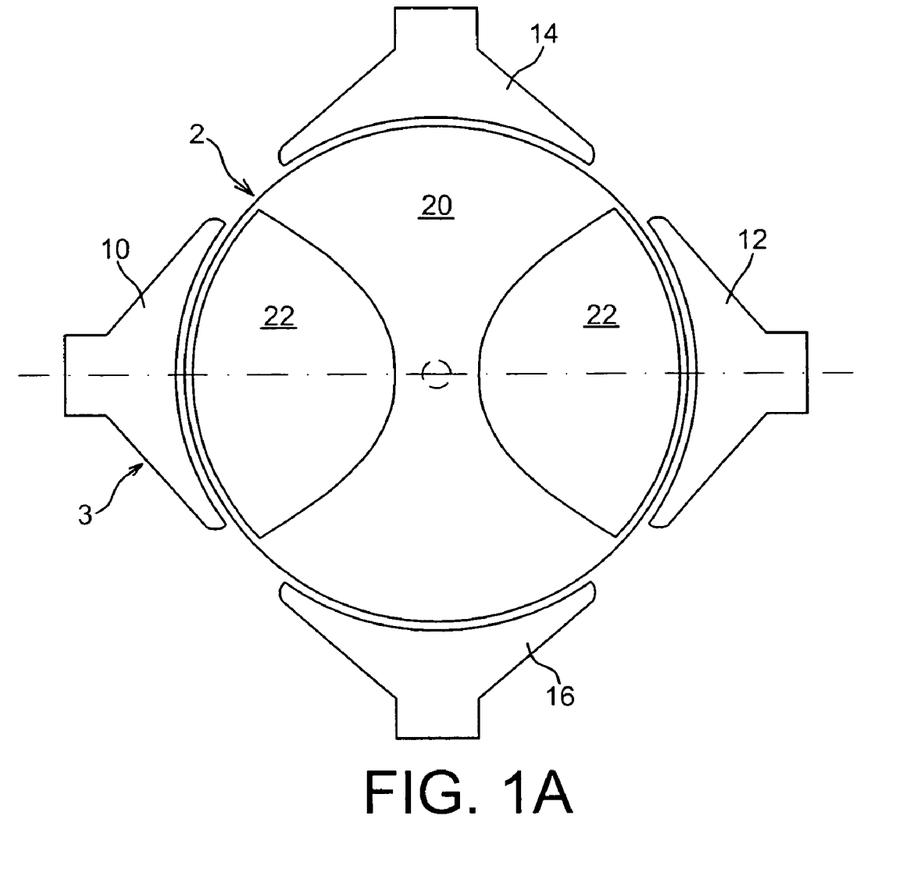
FIGS. 1A, 1B and 3A, 3B are examples of devices according to the invention.
Figure 1B:
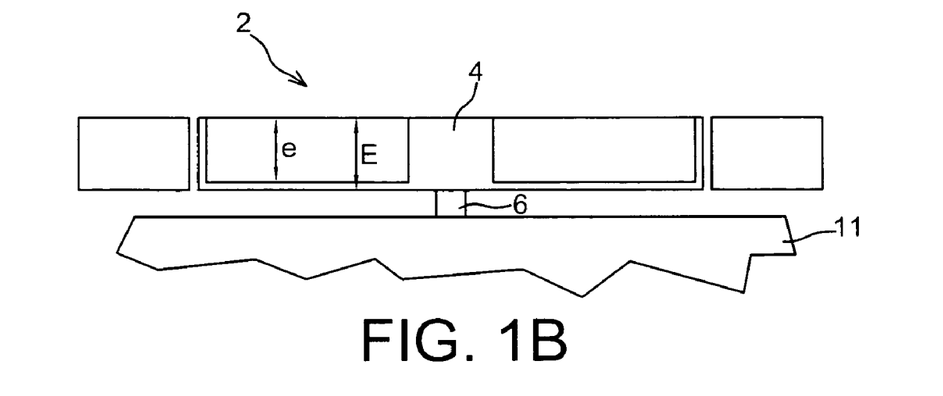

As can be seen on FIGS. 1A and 1B, the vibrating body 4 itself consists of two parts:
- a first part 20, made of a first material, for example made of monocrystalline silicon or nickel or diamond, or more generally of a material with a high Young's modulus (typically >100 GigaPascal).
- a second part 22 made of a second material, for example aluminium or gold or zinc or magnesium or more generally, of a material with a low Young's modulus (typically <100 GPa), and in any case strictly less than the first Young's modulus for the first material.

In order to obtain large deformations on a large surface at the detection transduction, the second material is present locally at the electrodes over a large thickness e (relative to the total thickness of the vibrating body), for example a thickness of between 70% and 100% of the thickness E of the vibrating body 4.

This second material is at least partially located facing a detection electrode, or in a cavity made in the first part 20.

It is placed so as to interact with the detection electrodes 10, 12.

This second material is preferably placed as close as possible to the transduction surface of the detection electrodes 10, 12. It may even be present at this transduction surface.

Finally, the volume of this second material is preferably sufficient so that the deformation gain is significant compared with the same vibrating body, which would be formed exclusively of the material 1.

Figure 2A:
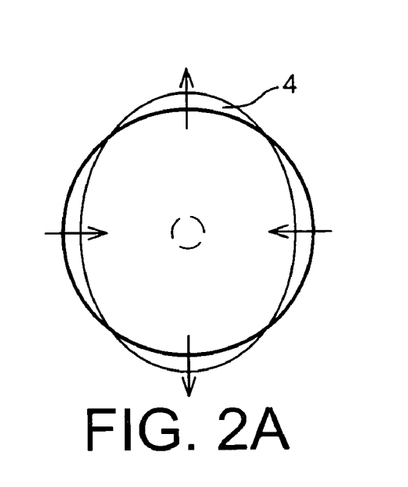
FIGS. 2A and 2B illustrate the deformed shape of a disk according to a specific mode.
Figure 2B:
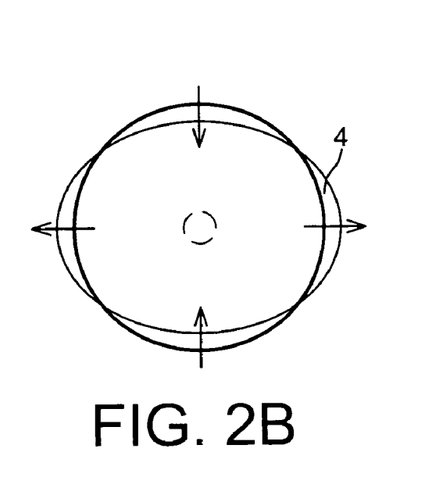

In the case in which the required vibration mode is the mode for which the deformed shape is shown in FIGS. 2A and 2B, sometimes called "Wine-Glass" mode, as described in the document by M. A. Abdelmoneum, M. U. Demirci and T. C. Nguyen, "Stemless wine-glass-mode disk micromechanical resonators" IEEE (2003), the component is usually provided with four electrodes, two excitation electrodes alternating with two detection electrodes.

The diagram in FIG. 1A shows one example of this type of component.

The second material is then at least partially arranged at the detection electrodes.

The arrows on FIGS. 2A and 2B show the direction of displacement and correspond to the location of the electrodes for a disk type resonator 4.

When the component is in operation, the vibrating body is biased. An input signal is transmitted from the excitation electrodes 14, 16 to the vibrating body 4 through electrostatic forces that are applied between each other (the electrodes 14, 16 being fixed). For any signal, the displacements of the vibrating body 4 are very small and cannot generate the output signal. When the input signal has a component corresponding to the resonant frequency of the vibrating body (which depends on the geometry of the vibrating body, for example the radius of the disk), the vibrating body starts mechanical resonance. The disk then deforms with a deformation component in a defined plan parallel to the substrate 11, or particularly or essentially with a deformation component, or defined by the body of the device and the electrodes. For example, it deforms as shown on FIGS. 2A and 2B for the "Wine-glass" mode. A current is then generated in the detection electrodes 10, 12 that are fixed.

This current increases all the more as the displacement of the vibrating body at the electrodes increases (relative to the air gap).

Figure 3A:
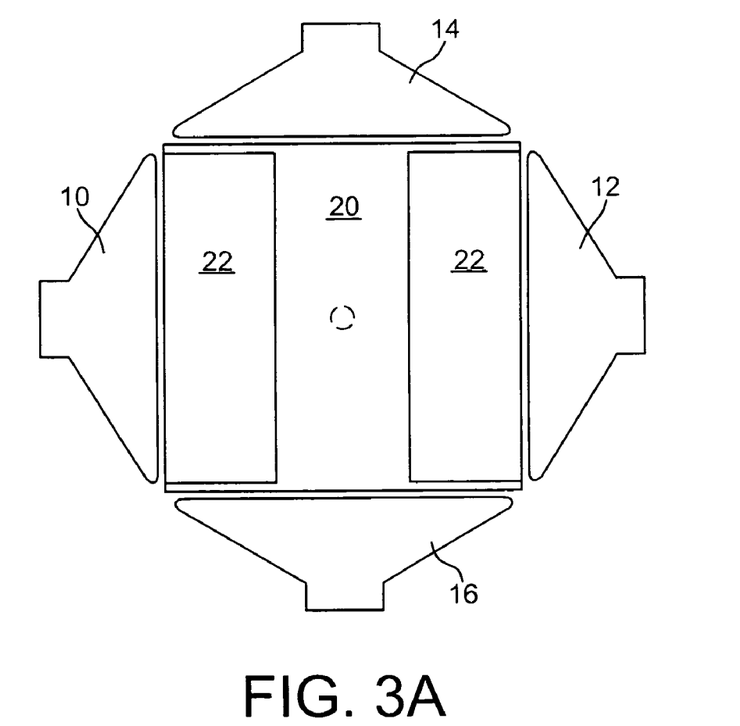
Figure 3B:
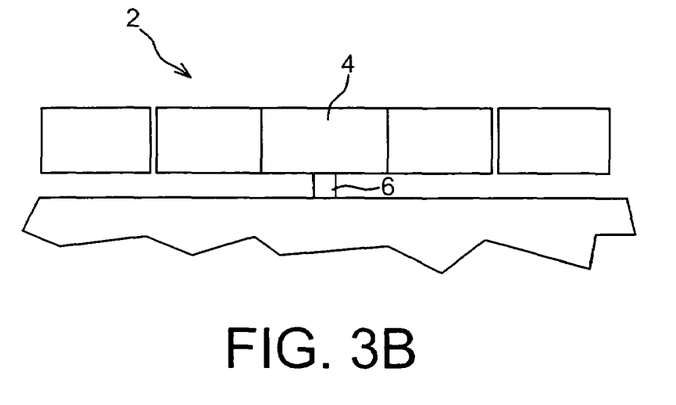

FIGS. 3A and 3B show a variant of the invention with a plate type composite resonator. In this embodiment, the presence of the material 22 is optimum with respect to the detection electrodes 10, 12.

One example embodiment of a device according to the invention will now be described.

Figure 5A:
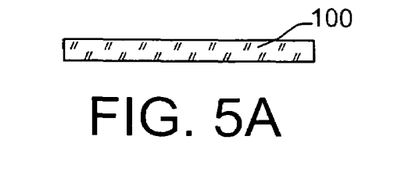

Such a process begins with selection and preparation of a silicon wafer 100 (FIG. 5A).

Figure 5B:
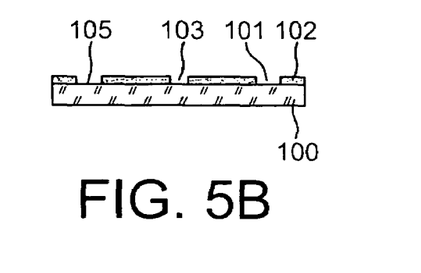

A layer 102 of silicon dioxide ($SiO_2$) is deposited on this wafer 100 and is etched after lithography (FIG. 5B). Etching opens up openings 101, 103, 105 on the substrate 100. The sacrificial insulating layer is a few micrometers thick, for example 2 µm thick.

Figure 5C:
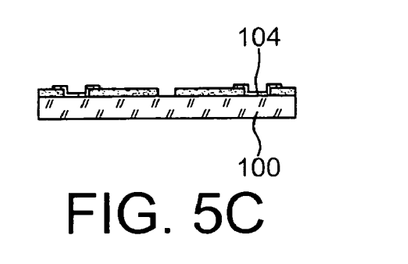

The next step is to deposit a silicon nitride layer $Si_3N_4$ 104 that is etched after lithography (FIG. 5C). This insulating layer is about 1 µm thick. It fills in some openings 101,105 made previously so as to enable electrodes to be isolated later.

Figure 5D:
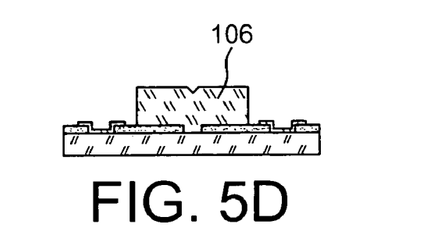
Figure 5E:
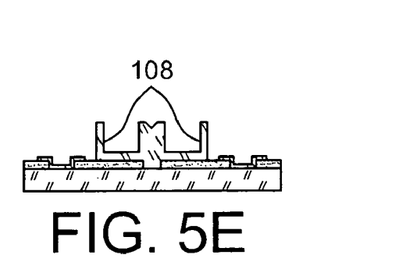

The next step is deposition of a silicon layer 106 over a thickness of about 3 µm. This layer is etched after lithography to form a base 106 (FIG. 5D) in which the cavities 108 can be etched (FIG. 5E), preferably over a large depth, for example between 70% and 95% of the thickness of the base.

Figure 5F:
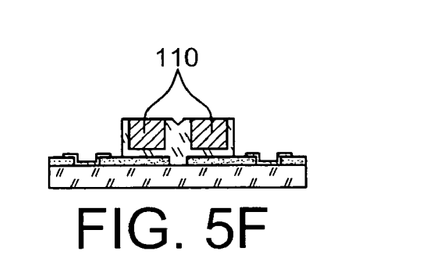

The next step is deposition of aluminium 110 in the cavities 108 (FIG. 5F), by lithography and etching. This is actually the second material of the vibrating body of the resonator (reference 22 on FIGS. 1 and 3), in accordance with this invention.

Figure 5G:
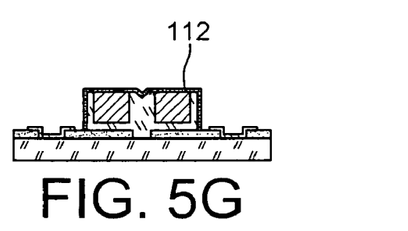

The next step is deposition of a sacrificial layer 112, for example made of silicon dioxide $SiO_2$, about 0.1 µm thick (FIG. 5G).

Figure 5H:
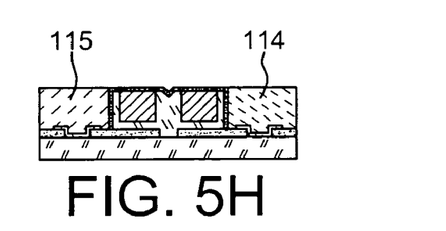

The next step is deposition of the material that will form the electrodes, for example silicon. The electrodes 114, 115 are obtained after deposition, flattening, lithography and etching (FIG. 5H).

Figure 5I:
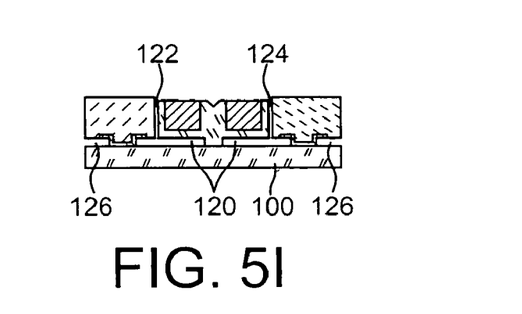

The next step is to release the structure by etching the sacrificial layer 102 and the sacrificial layer 112, thus releasing the cavities 120 and 126 between the device itself and the substrate 100, and the cavities 122, 124 between the vibrating body and the electrodes 114, (FIG. 5I).

Another embodiment according to the invention will be described with reference to FIGS. 6A-6J.

Figure 6A:
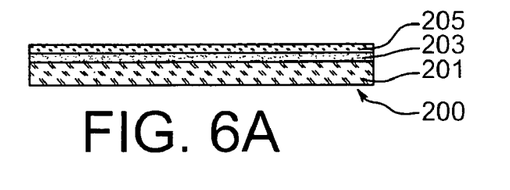

This process makes use of an SOI (silicon on insulator) substrate 200 comprising a substrate 201 for example made of silicon, an insulating layer 203, for example made of silicon dioxide $SiO_2$ which may be about 0.4 µm thick, and a layer of silicon 205, for example 0.2 µm thick.

Figure 6B:
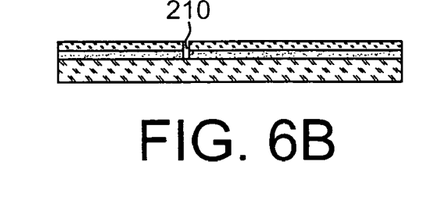
Figure 6C:
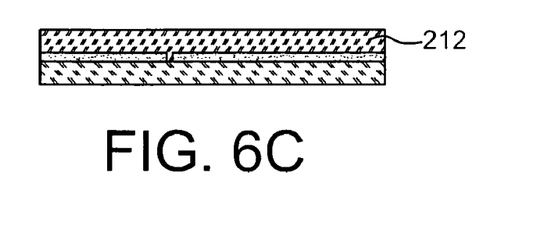

A first etching step is done so as to etch a pattern 210 in the layers 205 and 203, which will subsequently be used to make the base of the vibrating body (FIG. 6B).

The next step (FIG. 6C) is a step to clean the surface of the substrate, and epitaxial growth of a silicon layer 212, for example over a thickness of about 2.8 µm.

Figure 6D:
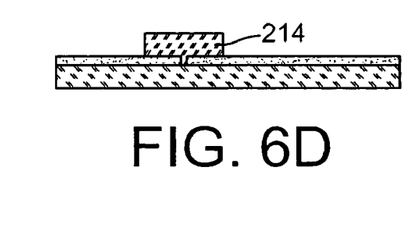

This layer is then etched so as to remove the vibrating body 21 (FIG. 6D).

Figure 6E:
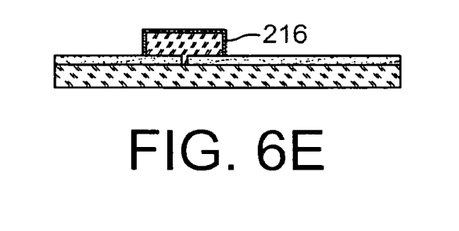

This body is oxidized so as to form a surface oxidation layer 216 (FIG. 6E). For example, this layer is made by heat treatment, and it may be between 0.01 µm and 0.3 µm thick.

Figure 6F:
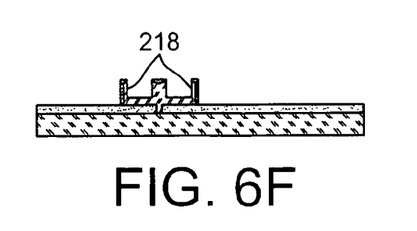

Boxes 218 are then etched in the oxide layer 216 and in the body 214. The depth of these boxes may be between 70% and 100% of the total thickness of the body 214.

Figure 6G:
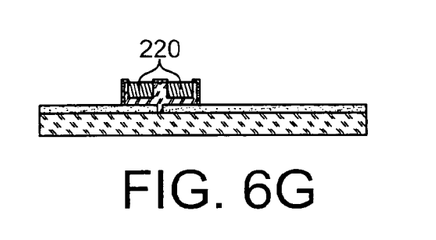
Figure 6H:
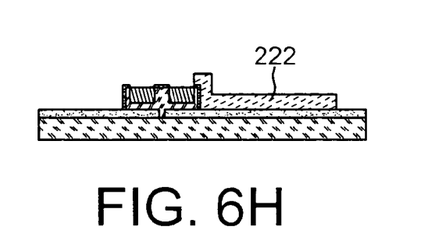

The next step is deposition and etching of aluminium 220 in the boxes 218 (FIG. 6G). Electrodes such as the electrode 222 (FIG. 6H), are then formed by deposition, for example of P++ doped poly-silicon, over a thickness of 2 to 3 µm.

Figure 6I:
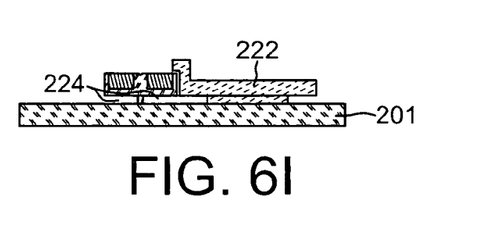

The structure of the vibrating body is then released by etching the sacrificial layer 203 of $SiO_2$, thus allowing cavities 224 to appear between the vibrating body itself and the substrate 201, and between the vibrating body and the electrodes 222 (FIG. 6I).

Figure 6J:
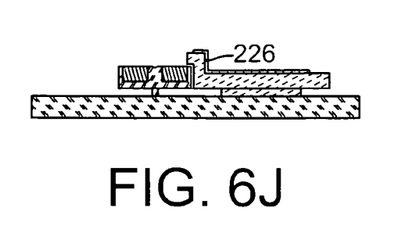

The next step is surface metallisation of the electrodes to form pads 226 (FIG. 6J).

This process can be used to obtain a resonator, in which the part corresponding to the part 20 in FIG. 1A is composed of mono-crystalline silicon made during an epitaxy step.

The anchorage of the vibrating body to the substrate is then made of the same crystal.

This can improve the mechanical characteristics of the vibrating body, by reducing loss sources that are interfaces between different materials, particularly in the case in which the central axis is made of poly-crystalline silicon, while the remainder of the vibrating body is made of monocrystalline silicon, or grain joints. The result is that performances are better than in known devices.

A device according to the invention may be small (typically 50 µm*50 µm).

Such a device is also stable in temperature: this component is not very sensitive to temperature variations: the single anchorage 6 (central in this case) limits the appearance of stresses due to differential expansion.

The steps in technological production of such a device are also compatible with integrated circuits (IC) techniques.

This device can also achieve high resonant frequencies: the use of a first material with high mechanical characteristics can produce high resonant frequencies (of the order of a hundred MHz) for dimensions of the order of about ten microns (and particularly for the dimensions already envisaged above, equal to 50 µm×50 µm).

Furthermore, a large displacement amplitude at transduction can be used to obtain a high signal level at the output from the component.

Figure 4:
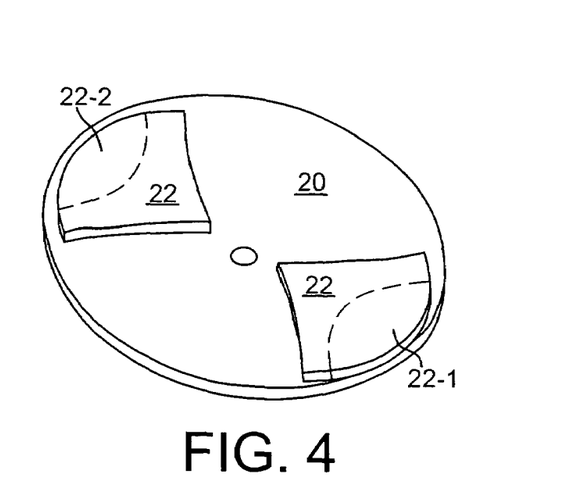
FIG. 4 shows the deformed shape of a composite disk according to the invention.

A finite element calculation also shows a larger displacement of the transduction surfaces at the implantation of the second material 22. FIG. 4 also illustrates the deformed shape of a component according to the invention, the most deformed zones being made of material 22 and more particularly zones 22-1, 22-2 located closest to the detection electrodes.

Simulations made show that for the same resonant frequency (60 MHz), the maximum displacement of the structure shown (first material: silicon, second material: aluminium) is greater than for a disk composed exclusively of silicon, by a factor of more than $10^3$.

The output current from the measurement electrodes is expressed according to the following equation:

$$i = -V_p \varepsilon_0 \varepsilon_r \frac{S}{(d_0 + x)^2} \frac{dx}{dt} + C \frac{dV_p}{dt}$$

where:
$V_p$ is the bias voltage of the vibrating body,
$\varepsilon_0, \varepsilon_r$ are the dielectric permittivity of a vacuum and the relative permittivity of air,
S is the transduction surface area related to the detection,
$d_o+x$ is the thickness of the air gap at the transduction surface,
C is the capacitive value of the detection surface at rest.

It can be seen that a large variation dx in the air gap (positive or negative) can result in large intensity variations and therefore a high signal level.

Conversely, this relation shows that for constant displacement, the bias applied to the vibrating body of the component is smaller than the bias applied to a resonator for which the vibrating body is made of a single material. Resonators described in the literature have a bias voltage from a few tens of volts to more than a hundred volts, while components according to the invention have lower bias voltages, typically between a few volts and a few tens of volts, for example between 2 V or 5V and 20 V or 30 V. This is an important advantage when considering integration of a chip.

Industrial applications relate to the domain of passive components for RF applications (reference oscillators, variable oscillators, filters), and all electronic and microelectronic fields using resonators.

The invention claimed is:

1. An electromechanical resonator comprising:
   a vibrating body;
   at least one excitation electrode and at least one detection electrode,
   wherein the vibrating body comprises a first part made of a first material with a first Young's modulus and a second part made of a second material with a second Young's modulus less than the first Young's modulus, the second part being located in a cavity of the first material and at least partially located facing the detection electrode.

2. A resonator according to claim 1, wherein the first Young's modulus is greater than 100 GPa.

3. A resonator according to claim 1, wherein the second Young's modulus is less than 100 GPa.

4. A resonator according to claim 1, wherein the first material is made of monocrystalline silicon or nickel or diamond.

5. A resonator according to claim 1, wherein the second material is made of aluminium or gold or zinc or magnesium.

6. A resonator according to claim 1, wherein the vibrating body is circular.

7. A resonator according to claim 1, wherein the vibrating body is square.

8. A resonator according to claim 1, comprising two excitation electrodes and two detection electrodes, arranged at 90° from each other.

9. A resonator according to claim 1, comprising two electrodes, each being an excitation and detection electrode, the two electrodes being diametrically arranged.

10. A resonator according to claim 1, wherein the second material is present locally over a thickness of between 70% and 100% of the thickness of the vibrating body.

11. A resonator according to claim 1, further comprising an anchor or a single base connecting it to a substrate.

12. A process for making an electromechanical resonator including a vibrating body itself including a first part made of a first material with a first Young's modulus, and a second part made of a second material with a second Young's modulus less than the first Young's modulus, at least one excitation electrode and at least one detection electrode, the second part of the vibrating body at least partially facing the detection electrode, the process comprising:
    etching at least one cavity in a base made of the first material with a first Young's modulus; and
    depositing the second material in the cavity with a second Young's modulus less than the first Young's modulus.

13. A process according to claim 12, further comprising producing electrodes facing the second material.

14. A process according to claim 12, further comprising etching to release the resonator from a substrate only leaving a connection base to the substrate.

15. A process according to claim 12, wherein each cavity is etched over a thickness between 70% and 95% of the thickness of the base.

16. A process according to claim 12, wherein the base is obtained by etching an epitaxied layer on an SOI substrate.

17. A process according to claim 12, wherein the base is made of monocrystalline silicon.

\* \* \* \* \*

UNITED STATES PATENT AND TRADEMARK OFFICE
CERTIFICATE OF CORRECTION

PATENT NO. : 7,612,484 B2 Page 1 of 1
APPLICATION NO. : 11/630773
DATED : November 3, 2009
INVENTOR(S) : Tripard et al.

It is certified that error appears in the above-identified patent and that said Letters Patent is hereby corrected as shown below:

On the title page, Item (86), the PCT information is incorrect. Item (86) should read:
-- (86) PCT No.: PCT/FR2005/050520

§ 371 (c) (1),
(2), (4) Date: Jan. 23, 2007 --

Signed and Sealed this

Fifth Day of January, 2010

David J. Kappos
*Director of the United States Patent and Trademark Office*